(12) United States Patent
Seidel et al.

(10) Patent No.: US 8,420,533 B2
(45) Date of Patent: Apr. 16, 2013

(54) METALLIZATION SYSTEM OF A SEMICONDUCTOR DEVICE COMPRISING ROUNDED INTERCONNECTS FORMED BY HARD MASK ROUNDING

(75) Inventors: Robert Seidel, Dresden (DE); Thomas Werner, Moritzburg (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 275 days.

(21) Appl. No.: 12/939,424

(22) Filed: Nov. 4, 2010

(65) Prior Publication Data

US 2011/0212616 A1 Sep. 1, 2011

(30) Foreign Application Priority Data

Feb. 26, 2010 (DE) .......................... 10 2010 002 454

(51) Int. Cl.
*H01L 21/44* (2006.01)
(52) U.S. Cl.
USPC ................................... 438/673; 257/E21.586
(58) Field of Classification Search .................. 438/641, 438/668, 671, 673, 713, 950
See application file for complete search history.

(56) References Cited

U.S. PATENT DOCUMENTS

| 6,511,902 B1* | 1/2003 | Liang et al. .................... 438/620 |
| 7,101,786 B2* | 9/2006 | Lee ................................ 438/633 |
| 2005/0287811 A1 | 12/2005 | Inukai .......................... 438/700 |

OTHER PUBLICATIONS

Translation of Official Communication from German Patent Office for German Patent Application No. 10 2010 002 454.6 dated Feb. 28, 2011.

* cited by examiner

*Primary Examiner* — Chandra Chaudhari
(74) *Attorney, Agent, or Firm* — Williams, Morgan & Amerson, P.C.

(57) ABSTRACT

In sophisticated metallization systems, vertical contacts and metal lines may be formed on the basis of a dual inlaid strategy, wherein an edge rounding or corner rounding may be applied to the trench hard mask prior to forming the via openings on the basis of a self-aligned via trench concept. Consequently, self-aligned interconnect structures may be obtained, while at the same time providing superior fill conditions during the deposition of barrier materials and conductive fill materials.

20 Claims, 10 Drawing Sheets

METALLIZATION SYSTEM OF A SEMICONDUCTOR DEVICE COMPRISING ROUNDED INTERCONNECTS FORMED BY HARD MASK ROUNDING

BACKGROUND OF THE INVENTION

1. Field of the Invention

Generally, the present disclosure relates to microstructures, such as advanced integrated circuits, and, more particularly, to conductive structures, such as copper-based metallization layers, comprising metal lines and vertical interconnects or vias.

2. Description of the Related Art

In the fabrication of modern microstructures, such as integrated circuits, there is a continuous drive to steadily reduce the feature sizes of microstructure elements, thereby enhancing the functionality of these structures. For instance, in modern integrated circuits, minimum feature sizes, such as the channel length of field effect transistors, have reached the deep sub-micron range, thereby increasing performance of these circuits in terms of speed and/or power consumption and/or diversity of functions. As the size of individual circuit elements is reduced with every new circuit generation, thereby improving, for example, the switching speed of the transistor elements, the available floor space for interconnect lines electrically connecting the individual circuit elements is also decreased. Consequently, the dimensions of these interconnect lines are also reduced to compensate for a reduced amount of available floor space and for an increased number of circuit elements provided per unit die area, as typically the number of interconnections required increases in an over-proportional manner relative the number of circuit elements. Thus, a plurality of stacked wiring layers, also referred to as metallization layers, are usually provided, wherein individual metal lines of one metallization layer are connected to individual metal lines of an overlying or underlying metallization layer by so-called vias. Despite the provision of a plurality of metallization layers, reduced dimensions of the interconnect lines are necessary to comply with the enormous complexity of, for instance, modern CPUs, memory chips, ASICs (application specific ICs) and the like.

Advanced integrated circuits, including transistor elements having a critical dimension of 0.05 μm and even less, may, therefore, typically be operated at significantly increased current densities of up to several kA per cm$^2$ in the individual interconnect structures, despite the provision of a relatively large number of metallization layers, owing to the significant number of circuit elements per unit area. Consequently, well-established materials, such as aluminum, are being replaced by copper and copper alloys, a material with significantly lower electrical resistivity and improved resistance to electromigration, even at considerably higher current densities compared to aluminum. The introduction of copper into the fabrication of microstructures and integrated circuits comes along with a plurality of severe problems residing in copper's characteristic to readily diffuse in silicon dioxide and a plurality of low-k dielectric materials, which are typically used in combination with copper in order to reduce the parasitic capacitance within complex metallization layers. In order to provide the necessary adhesion and to avoid the undesired diffusion of copper atoms into sensitive device regions, it is, therefore, usually necessary to provide a barrier layer between the copper and the dielectric material in which the copper-based interconnect structures are embedded. Although silicon nitride is a dielectric material that effectively prevents the diffusion of copper atoms, selecting silicon nitride as an interlayer dielectric material is less than desirable, since silicon nitride exhibits a moderately high permittivity, thereby increasing the parasitic capacitance of neighboring copper lines, which may result in non-tolerable signal propagation delays. Hence, a thin conductive barrier layer that also imparts the required mechanical stability to the copper is usually formed so as to separate the bulk copper from the surrounding dielectric material, thereby reducing copper diffusion into the dielectric materials and also reducing the diffusion of unwanted species, such as oxygen, fluorine and the like, into the copper.

Furthermore, the conductive barrier layers may also provide highly stable interfaces with the copper, thereby reducing the probability of significant material transport at the interface, which is typically a critical region in view of increased diffusion paths that may facilitate current-induced material diffusion. Currently, tantalum, titanium, tungsten and their compounds, with nitrogen and silicon and the like, are preferred candidates for a conductive barrier layer, wherein the barrier layer may comprise two or more sub-layers of different composition so as to meet the requirements in terms of diffusion suppressing and adhesion properties.

Another characteristic of copper significantly distinguishing it from aluminum is the fact that copper may not be readily deposited in larger amounts by chemical and physical vapor deposition techniques, thereby requiring a process strategy that is commonly referred to as the damascene or inlaid technique. In the damascene process, first a dielectric layer is formed which is then patterned to include trenches and/or vias which are subsequently filled with copper, wherein, as previously noted, prior to filling in the copper, a conductive barrier layer is formed on sidewalls of the trenches and vias. The deposition of the bulk copper material into the trenches and vias is usually accomplished by wet chemical deposition processes, such as electroplating and electroless plating, thereby requiring the reliable filling of vias with an aspect ratio of 5 and more with a diameter of 0.3 μm or even less, in combination with trenches having a width ranging from 0.1 μm to several μm. Electrochemical deposition processes for copper are well established in the field of electronic circuit board fabrication. However, for the dimensions of the metal regions in semiconductor devices, the void-free filling of high aspect ratio vias is an extremely complex and challenging task, wherein the characteristics of the finally obtained copper-based interconnect structure significantly depend on process parameters, materials and geometry of the structure of interest. Since the basic geometry of interconnect structures is substantially determined by the design requirements and may, therefore, not be significantly altered for a given microstructure, it is of great importance to estimate and control the impact of materials, such as conductive and non-conductive barrier layers, of the copper microstructure and their mutual interaction on the characteristics of the interconnect structure so as to insure both high yield and the required product reliability.

In addition to achieving high production yield and superior reliability of the metallization system, it is also important to achieve production yield and reliability on the basis of a high overall throughput of the manufacturing process under consideration. For instance, the so-called dual damascene process is frequently used, in which a via opening and a corresponding trench are filled in a common deposition sequence, thereby providing superior process efficiency.

Upon further reducing the lateral dimensions of the metal features, the corresponding patterning process and a subsequent deposition of the conductive materials represent a very complex process sequence, for instance in terms of alignment accuracy, reliable void-free filling of the resulting openings in the dielectric material and the like. For example, in the inlaid technique, in which the via openings and the trenches for the metal lines are filled in a common deposition sequence, the via openings and the trenches have to be precisely adjusted, not only in view of superior electrical performance, but also in view of deposition-related aspects, since the filing in of conductive materials, such as barrier materials and the actual highly conductive fill metal, into a high aspect ratio via opening through a trench of lateral dimensions of several 100 nm and significantly less may per se represent a very challenging task. In frequently used approaches, the via opening may be formed first in the dielectric material of the metallization layer under consideration and subsequently the trench may be formed, wherein a trench mask may be provided prior to forming the via etch mask. Although this approach may result in a very efficient manufacturing strategy, problems may arise upon further shrinking the critical dimensions, as will be described with reference to FIGS. 1a-1i.

FIG. 1a schematically illustrates a cross-sectional view of a semiconductor device 100 comprising a substrate 101, which is to represent any appropriate material or material layers including circuit elements, such as transistors, capacitors, resistors and the like, as are typically required in sophisticated semiconductor devices. For convenience, any such circuit elements are not shown in FIG. 1a, wherein it should be appreciated, however, that these circuit elements, such as field effect transistors and the like, may be formed on the basis of critical dimensions of approximately 50 nm and less in sophisticated applications. Furthermore, the device 100 comprises a device layer or level 110, which may represent a metallization layer of the device 100 or which may represent any other device layer, such as a contact level and the like, or a semiconductor layer, in which circuit features are provided that need to be contacted via a metallization system of the device 100. For example, the device layer 110 may comprise a dielectric material 111, in which are embedded conductive regions 112, such as contact areas of transistors, metal lines, contact elements and the like. For example, the conductive regions 112 may comprise any appropriate conductive material, such as metal silicide, metals, highly-doped semiconductor materials and the like. Furthermore, the device 100 comprises a metallization layer 120, which may represent one of a plurality of metallization layers, since typically, in complex semiconductor devices, a plurality of stacked wiring levels may be required, as is also discussed above. The metallization layer 120 comprises a dielectric material 121, such as a low-k dielectric material, an ultra-low-k (ULK) material and the like, which are to be understood as dielectric materials having a dielectric constant of 3.0 or 2.7 and less. It should be appreciated that, typically, low-k dielectric materials, and in particular ULK materials, may have a significantly reduced mechanical stability due to a reduced material density, which may be considered appropriate for obtaining the low values of the dielectric constant. Similarly, such materials may be sensitive with respect to the exposure to reactive process atmospheres, such as plasma-assisted etch processes and the like. Consequently, frequently, a dielectric cap material 123, for instance in the form of silicon dioxide and the like, may be provided so as to enhance the overall stability of the low-k dielectric material 121. Furthermore, an etch stop material 122, such as silicon carbide based materials including nitrogen and the like, or combinations of various materials, are typically used, which represent a compromise between dielectric behavior and etch resistivity.

Furthermore, in the manufacturing stage shown, a hard mask material 102 is formed above the dielectric materials of the metallization layer 120, which is used during the patterning of the dielectric materials 123, 121 and 122 upon providing appropriate trenches and via openings for the metallization layer 120. The hard mask material 102 may be provided in the form of a plurality of materials, such as titanium nitride, titanium, tantalum nitride, aluminum and the like, which may provide high etch resistivity at a reduced layer thickness. Furthermore, a resist mask 103 is formed above the hard mask material 102 and comprises openings 103A, which substantially determine the lateral size and position of metal lines to be formed in the metallization layer 120.

Typically, the semiconductor device 100 may be formed on the basis of the following process techniques. After providing any circuit elements in and above the substrate 101 in accordance with the overall device requirements, the device layer 110 is formed in accordance with any desired process strategy. It may be assumed, in this example, that the layer 110 represents a metallization layer and the conductive regions 112 represent metal lines of the layer 110. In this case, similar process techniques may be applied as will be explained for the metallization layer 120. Hence, after completing the layer 110, the etch stop material 122 is deposited, for instance, by plasma-enhanced chemical vapor deposition (CVD) on the basis of well-established deposition recipes, thereby appropriately providing material composition and layer thickness of the etch stop material 122. It should be appreciated that the layer 122 may comprise two or more sub-layers, depending on the overall process requirements. Thereafter, the dielectric material 121 is formed by any appropriate deposition technique, such as CVD, spin-on techniques and the like, depending on the characteristics of the material 121. For example, a plurality of silicon dioxide based materials having a reduced material density are well established in the art and may be used for the material 121. Frequently, additional treatments may be applied so as to further reduce the overall dielectric constant, for instance by reducing the material density and the like, thereby, however, also typically reducing the overall stability of the material 121. Next, the material layer 123 may be formed so as to impart superior stability to the sensitive dielectric material 121. The hard mask material 102 may be formed on the basis of any appropriate deposition technique, such as physical vapor deposition (PVD), CVD and the like. Thereafter, any further materials, if required, may be provided so as to finally form the resist mask 103 on the basis of sophisticated lithography techniques. It should be appreciated that the opening 103A may have a lateral critical dimension of several hundred nanometers and significantly less, depending on the metallization level and the complexity of the semiconductor device 100. For example, the opening 103A may have a width of 100 nm and less. On the basis of the resist material 103, the hard mask material 102 may be patterned by using plasma-assisted etch recipes, wherein the material layer 123 may act as an efficient etch stop material in order to avoid undue interaction of the reactive etch ambient with the sensitive dielectric material 121.

FIG. 1b schematically illustrates the device 100 after the removal of the resist mask 103 (FIG. 1a) and with corresponding mask openings 102A, which may substantially correspond in size and position to the openings 103A as shown in FIG. 1a. Consequently, the mask openings 102A may thus define the size and position of trenches to be formed in the dielectric materials 123 and 121.

FIG. 1c schematically illustrates the device 100 with a further etch mask 104 formed above the hard mask 102 in order to define the lateral size and position of via openings to be formed so as to connect to the conductive regions 112. As is illustrated, the openings 104A may thus expose a portion of the mask openings 102A, wherein, depending on the alignment accuracy upon forming the mask 104, a certain degree of misalignment may occur so that the opening 104A and the mask opening 102A may not be perfectly aligned to each other, although these openings may have substantially the same lateral dimensions in the horizontal direction of FIG. 1c. That is, typically, a via opening may have to be provided with substantially the same lateral dimensions as a trench in order to avoid undue local extensions of the metal lines, which could otherwise result in increased leakage currents between adjacent metal lines that are to be formed on the basis of the mask openings 102A in a later manufacturing stage.

FIG. 1d schematically illustrates a top view of the device 100 according to the manufacturing stage as shown in FIG. 1c. As illustrated, the openings 104A may be slightly misaligned with respect to the mask openings 102A, thereby exposing the material 123 and a portion of the material 102 within the openings 104A. Consequently, a distance 102D may be reduced compared to a desired target distance upon actually forming the metal lines and vias on the basis of the mask arrangement as shown in FIG. 1d, so that corresponding increased process tolerance may have to be taken into consideration upon designing the semiconductor device 100.

FIG. 1e schematically illustrates the device 100 in a cross-sectional view when exposed to an etch process 105, in which an appropriate plasma-assisted etch recipe is applied so as to etch through the material 123 and finally through the material 121 on the basis of the masks 102 and 104. In the example shown, the etch process 105 is performed on the basis of an etch chemistry that is substantially not selective with respect to the mask material 102 so as obtain the desired target width of a via opening 121V, which would otherwise be reduced by a difference D as shown in FIG. 1e due to the misalignment between the openings 104A and 102A, as discussed above. In this case, however, the distance between two neighboring metal lines will be reduced, as previously explained with reference to FIG. 1d.

FIG. 1f schematically illustrates the device 100 according to a further strategy, in which the probability of any misalignments may be reduced by providing the via etch mask 104 with openings 104B having an increased lateral dimension along the width direction, which is to be understood as the horizontal direction in FIG. 1f. That is, the etch mask 104 is provided on the basis of an increased dimension, which is selected such that any process variations during the lithography process are taken into consideration and are accommodated in the lateral dimension in the opening 104B. Consequently, in this case, a maximum allow-able process variation during the patterning of the etch mask 104 may still result in a complete exposure of the mask opening 102A.

FIG. 1g schematically illustrates a top view of the device 100 according to this strategy, wherein the openings 104B may have appropriate dimensions, or may have a lateral extension compared to the openings 104A as shown in FIG. 1d, that ensure the alignment of the openings 104B and 102A.

The mask 104 is typically provided in the form of an organic material, such as a resist material or as a polymer material, possibly including two or more individual material layers so as to provide a superior surface topography, and also providing anti-reflective coating (ARC) capabilities, if required. For example, resist materials or any other polymer materials may be efficiently applied by spin-on techniques, followed by appropriate treatments and a subsequent exposure on the basis of appropriate photomasks, which may have appropriate mask features for providing the openings 104A or 104B, depending on the selected process strategy.

FIG. 1h schematically illustrates the semiconductor device 100 in a further advanced manufacturing stage, when using the self-aligned mask 104 including the mask openings 104B in combination with the etch process 105, which is now to be performed on the basis of an etch chemistry that exhibits a high selectivity with respect to the mask 102. Consequently, in the horizontal direction, the corresponding via openings 121V are delineated by the mask opening 102A and are thus self-aligned to corresponding trenches, which are to be formed in a later manufacturing stage on the basis of the hard mask layer 102. After the etch process 105, which may be appropriately controlled on the basis of the etch stop layer 122, the mask 104 is removed, for instance, by oxygen plasma, wet chemical etch recipes and the like, followed by a further anisotropic etch process, which may, for instance, be performed on the basis of a similar etch chemistry as the process 105, so as to form trenches in the dielectric material 121.

FIG. 1i schematically illustrates the device 100 in a further advanced manufacturing stage. As illustrated, a conductive barrier material 124 is formed within the via opening 121V and thus also in a trench formed in the dielectric material 121 in an upper portion of the material 121 extending in a direction perpendicular to the drawing plane of FIG. 1i. Furthermore, a conductive fill material 125, such as a copper material, is formed in the via opening 121V, thereby providing a desired high conductivity. In the example shown, the hard mask 102 may still be present and may be removed together with any excess material of the layers 124, 125, for instance on the basis of a chemical mechanical polishing (CMP) process. In other cases, the material 102 may be removed prior to filing in the materials 124, 125, in order to reduce the resulting aspect ratio, in particular for the via opening 121V. The deposition of the material 124 and also of the material 125 may thus require the deposition into a high aspect ratio so that an increased layer thickness for the barrier layer 124 may be required so as to reliably cover any critical areas within the via opening 121V. On the other hand, the via openings 121V may be reduced in width at the upper edges thereof during the deposition of the material 124, when reliably covering, in particular, the sidewall areas at the bottom of the via 121V, so that the subsequent deposition of the actual fill material 125 may also be inferior, at least within the vias 121V. Therefore, in some process strategies, the hard mask 102 is removed prior to depositing the materials 124 and 125, possibly in combination with a certain degree of corner rounding, which, however, may result in undue exposure of the sensitive material 121 to reactive process atmospheres, which may thus result in undue damage of the low-k material.

Consequently, although the self-aligned approach for forming the via openings 121V may result in a precise alignment of trenches and via openings, extremely sophisticated process conditions may have to be dealt with upon filling in the conductive materials.

The present disclosure is directed to various methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides manufacturing techniques in which high aspect ratio openings for any vertical interconnects, such as contact elements, vias and the like, may be provided on the basis of a dual inlaid technique with a self-aligned behavior, while at the same time superior process conditions may be provided during the deposition of the conductive material in the trenches and vertical openings. To this end, the hard mask material may be subjected to an "edge rounding" or "corner rounding" process prior to performing the via etch process on the basis of an etch chemistry that is selective to the hard mask material. Consequently, during the subsequent via etch process, the tapered cross-sectional shape of the trench mask may thus result in a certain degree of corner rounding of the resulting via opening, thereby providing superior deposition conditions substantially without exposing the sensitive dielectric material to any reactive process atmospheres, as may presently be the case in conventional process strategies. On the other hand, the slightly increased via opening in the trench may nevertheless be efficiently aligned to the trench due to the selective etch process and the possibility of providing the via etch mask with mask openings of sufficient lateral size so as to take into consideration any process-related variations.

One illustrative method disclosed herein comprises forming a first etch mask above a dielectric material of a metallization layer of a semiconductor device, wherein the first etch mask comprises a mask opening corresponding to a trench to be formed in the dielectric material. The method further comprises performing a material erosion process so as to round edges of the mask opening. Additionally, the method comprises forming a second etch mask above the first etch mask after performing the material erosion process, wherein the second etch mask determines, in combination with the mask opening, a lateral position of a via opening to be formed in the dielectric material so as to connect to the trench. Moreover, the method comprises performing a first etch process so as to form the via opening by using the first and second etch masks as an etch stop material. Finally, the method comprises performing a second etch process in order to form the trench by using the first etch mask as an etch stop material.

A further illustrative method disclosed herein comprises forming a trench hard mask above a dielectric material of a metallization layer of a semiconductor device, wherein the trench hard mask comprises a first mask opening having an upper edge and a bottom. The method further comprises increasing a width of the first mask opening selectively at least in a portion of the upper edge while preserving a width of the first mask opening at the bottom. Additionally, the method comprises forming a via etch mask above the trench hard mask, wherein the via etch mask comprises a second mask opening that is positioned to expose a portion of the first mask opening. Moreover, the method comprises forming a via opening in the dielectric material by using the trench hard mask and the via etch mask as an etch mask. Finally, the method comprises forming a trench in the dielectric material by using the trench hard mask.

A still further illustrative method disclosed herein relates to forming a metallization system of a semiconductor device. The method comprises forming a dielectric layer above a substrate, wherein the dielectric layer comprises a low-k dielectric material. The method further comprises forming a hard mask above the dielectric layer so as to include a mask opening that defines the lateral size and position of a trench of a metal line to be formed in the dielectric layer. The method additionally comprises a rounding of upper edges of the mask opening so as to increase a width of the mask opening at the upper edges. Furthermore, a via etch mask is formed above the hard mask so as to expose a portion of the mask opening and a portion of the hard mask laterally adjacent to the mask opening. The method additionally comprises forming a via opening in the dielectric layer by using the hard mask and the via etch mask as etch masks. Moreover, the via etch mask is removed and the trench is formed in the dielectric layer by using the hard mask. Finally, a conductive material is formed in the trench and the via opening.

BRIEF DESCRIPTION OF THE DRAWINGS

The disclosure may be understood by reference to the following description taken in conjunction with the accompanying drawings, in which like reference numerals identify like elements, and in which.

Figure 1A:
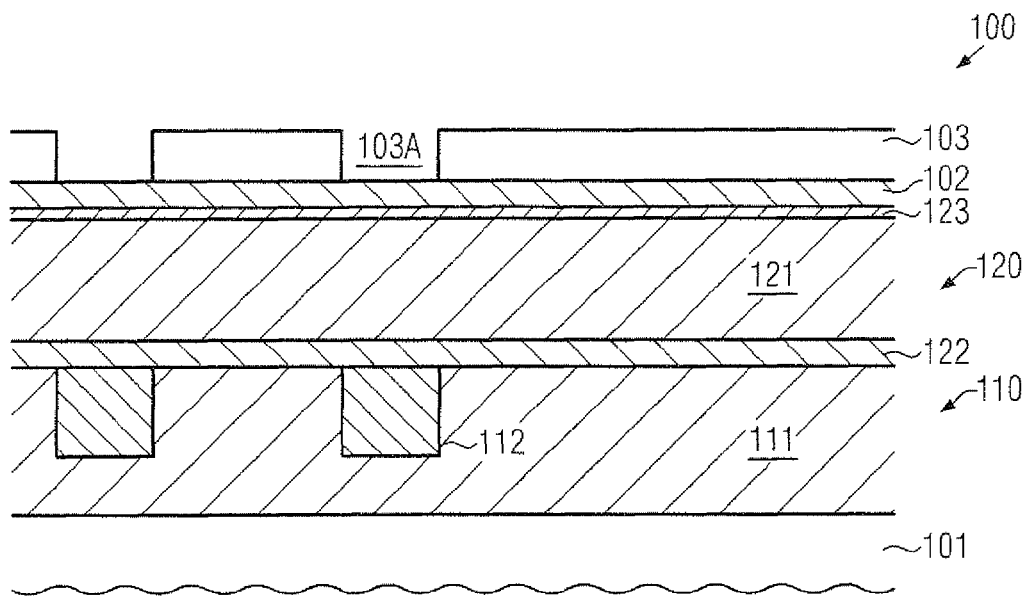
FIGS. 1a-1c schematically illustrate cross-sectional views of a semiconductor device during various manufacturing stages in forming a metallization layer according to a conventional process strategy for providing the trench mask first.
Figure 1B:
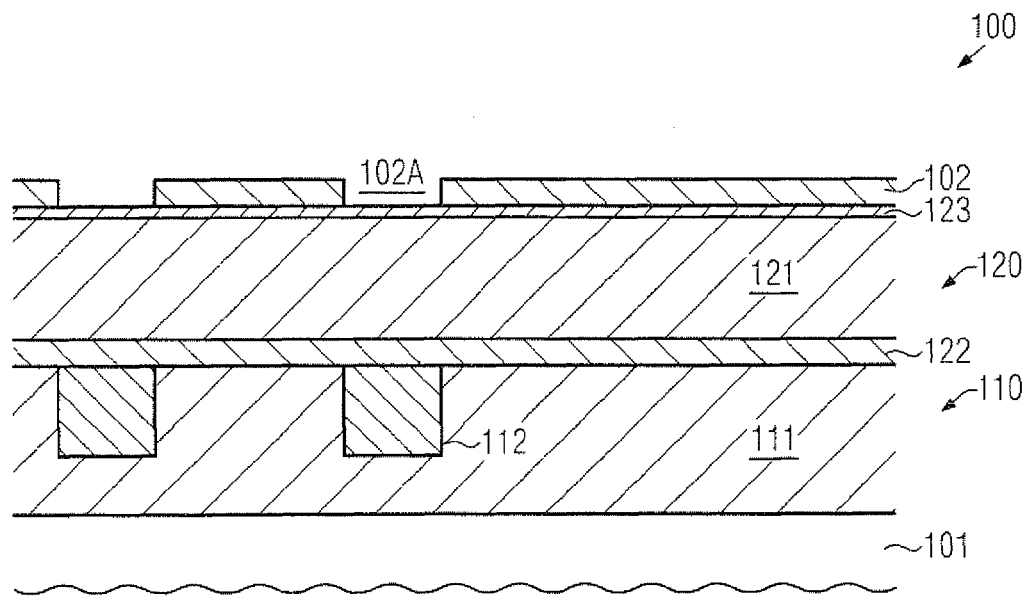
Figure 1C:
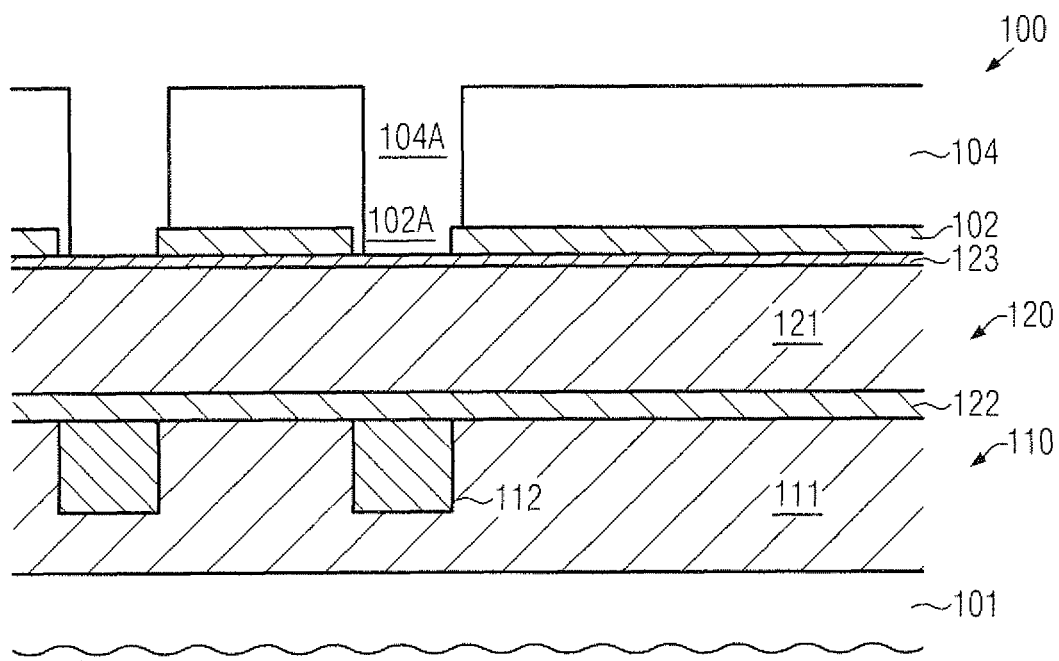
Figure 1D:
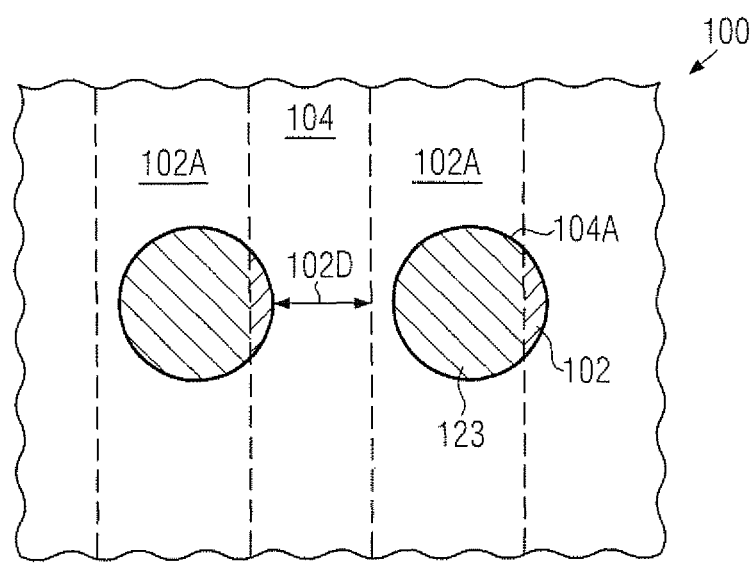
FIG. 1d schematically illustrates a top view of the semiconductor device, in which a certain degree of misalignment is illustrated.
Figure 1E:
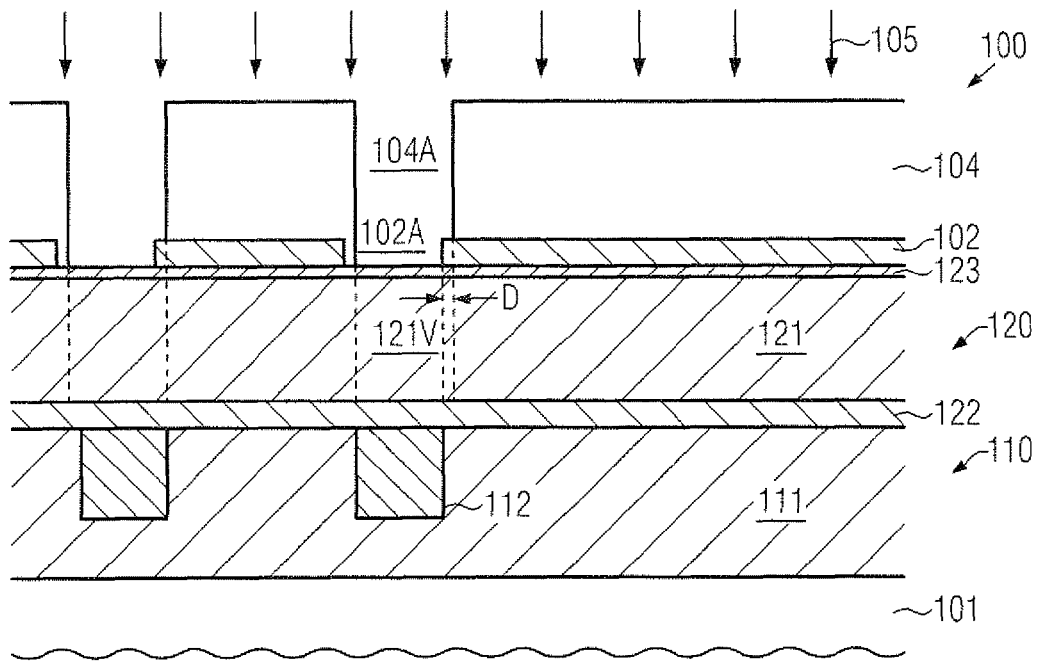
FIG. 1e schematically illustrates a cross-sectional view of the device during a via etch process based on misaligned mask openings, according to conventional strategies.
Figure 1F:
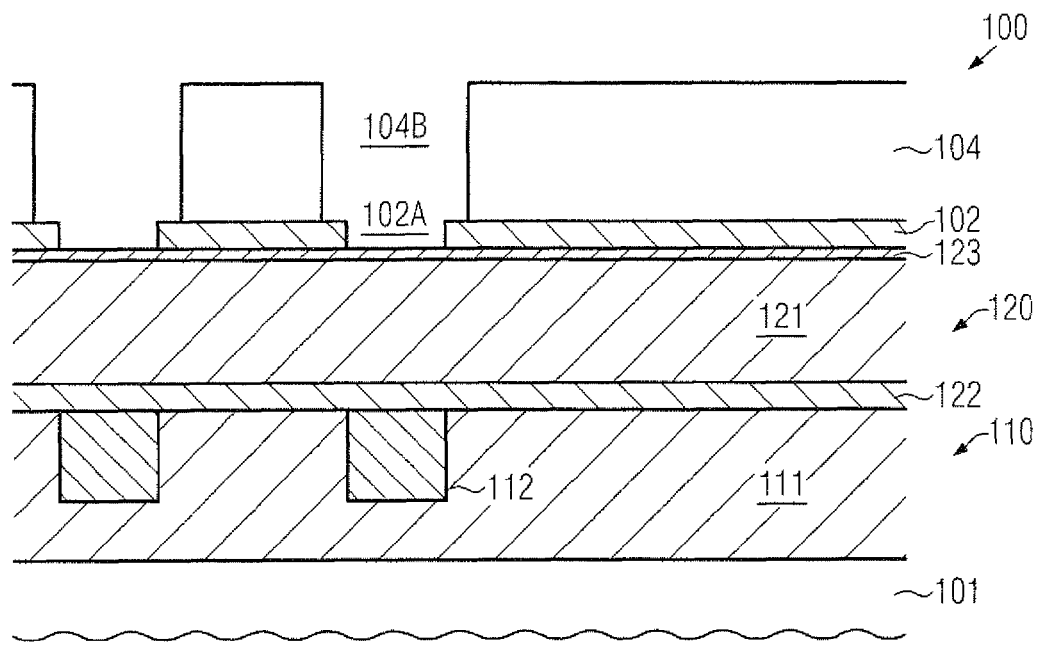
FIGS. 1f-1g schematically illustrate a cross-sectional view and a top view, respectively, in a manufacturing phase of the conventional strategy, in which via mask openings with extensions may be provided so as to obtain a self-aligned arrangement of the via opening and the trench during the further processing.
Figure 1G:
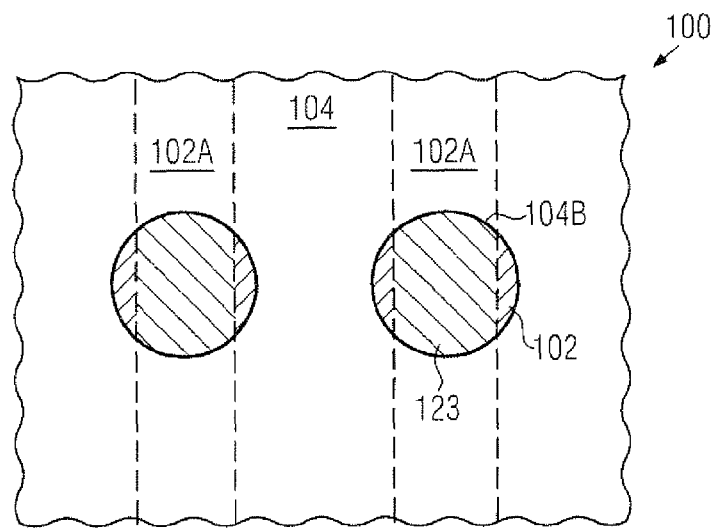
Figure 1H:
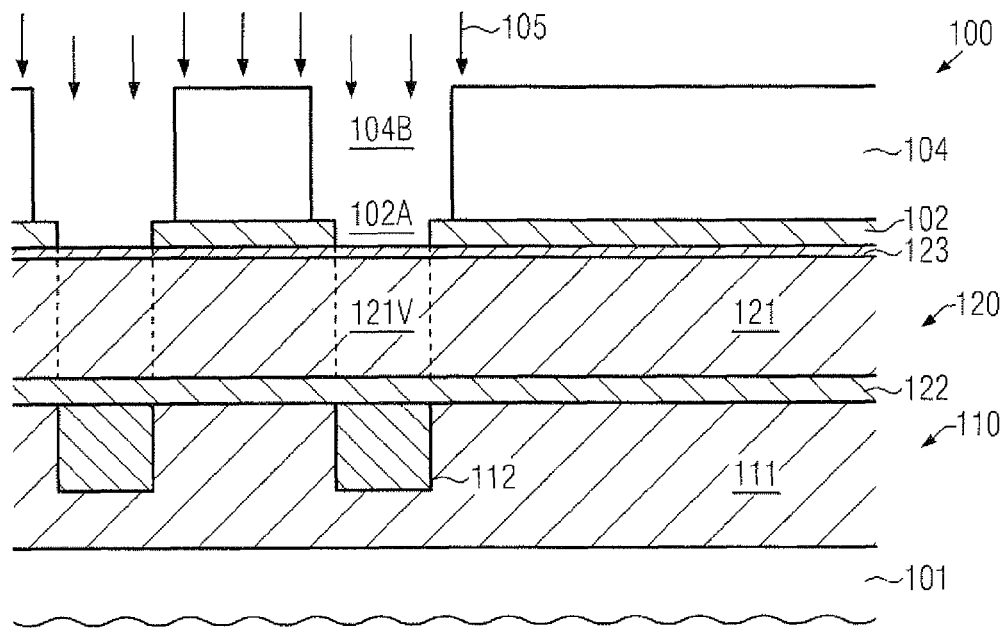
FIGS. 1h-1i schematically illustrate cross-sectional views of the semiconductor device in further advanced manufacturing stages, according to conventional strategies.
Figure 1I:
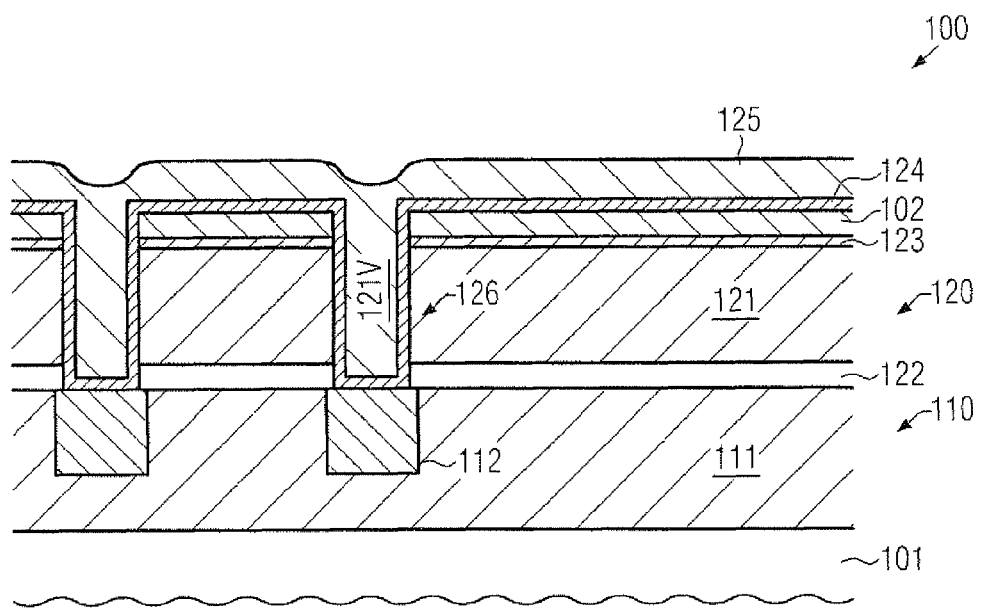

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure provides manufacturing techniques in which a self-aligned positioning of via openings or any other vertical interconnects, such as contact elements, may be accomplished with respect to metal lines to be formed in a metallization layer by using an etch mask providing sufficient process margins with respect to any patterning-related process variations. Additionally, the cross-sectional shape of the resulting via openings may be improved with respect to the subsequent metal deposition by appropriately treating the hard mask of the trench etch mask so that, at least in the area corresponding to the via openings, tapered mask openings may be provided. In some illustrative embodiments, the tapering may be accomplished by performing a material erosion process so as to preferably remove material at the upper edges of mask openings of the trench mask, thereby achieving an increased width at the top of the openings, while substantially maintaining the desired width at the bottom of the mask openings. To this end, the hard mask material may be exposed to any appropriate reactive process atmosphere, such as a plasma-assisted etch process, in which a certain degree of edge or corner rounding may be achieved. In other cases, an ion bombardment, for instance in the form of an ion sputtering process, may be applied, in which accelerated ions may be directed to the surface, thereby reliably removing material at the edge of mask openings, while creating significantly less material erosion on horizontal and extended vertical surface areas. Consequently, upon providing the via etch mask and forming via openings on the basis of a moderately high etch selectivity with respect to the trench mask material, the tapered cross-sectional shape may at least partially be transferred into the dielectric material and may also result in a slightly increased lateral dimension within the trench, however, without unduly increasing the overall lateral width of the trench. Furthermore, upon forming the trench in the dielectric material, the edge rounding may also result in a slightly tapered cross-sectional shape of the trenches along the entire length, thereby also providing superior deposition behavior, however, without unduly increasing the width of the trenches.

In other illustrative embodiments, the corner rounding or edge rounding may be performed in the presence of the via etch mask, thereby restricting the area for providing slightly increased width to the neighborhood of the vertical interconnects to be formed.

With reference to FIGS. 2a-2j, further illustrative embodiments will now be described in more detail, wherein reference may also be made to FIGS. 1a-1i, if appropriate.

Figure 2A:
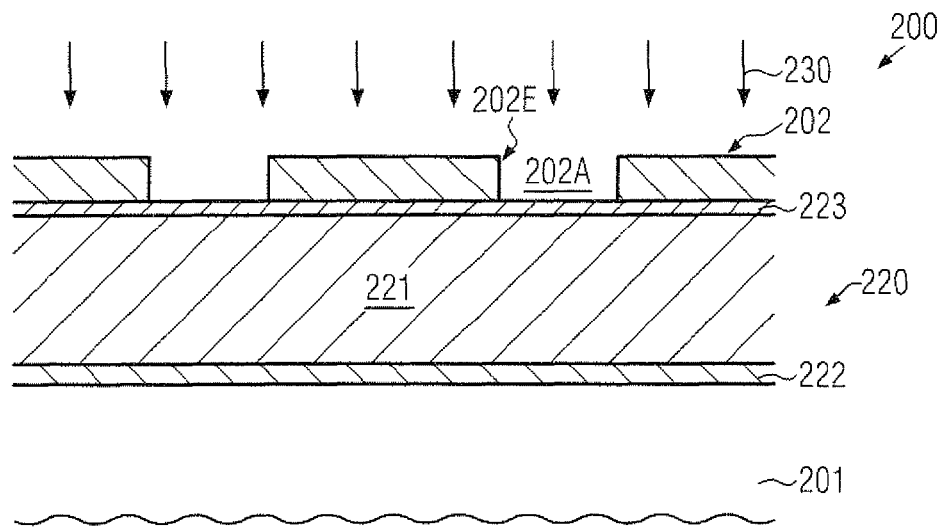
FIGS. 2a-2e schematically illustrate cross-sectional views of a semiconductor device during various manufacturing stages in forming via openings with a self-aligned behavior with a superior cross-sectional shape, according to illustrative embodiments.

FIG. 2a schematically illustrates a cross-sectional view of a semiconductor device 200, comprising a substrate 201, above which may be provided a metallization system, which, for convenience, is illustrated as a single metallization layer 220. Furthermore, as is also previously discussed with reference to the device 100, the substrate 201 may represent any device configuration, including circuit elements, contact levels, other metallization layers and the like, in which a further metallization layer, such as the layer 220, may be required for interconnecting any circuit elements according to a specific circuit layout. Consequently, the metallization layer 220 may be understood as, for instance, a very first metallization layer, which may connect to contact areas of semiconductor-based circuit elements, such as transistors, thereby implementing a contact structure for these circuit elements, while, in other cases, the layer 220 may have to be connected to a lower lying metallization layer on the basis of vertical interconnects, which are also referred to herein as vias. As previously discussed, the substrate 201 may comprise circuit elements that may be formed on the basis of critical dimensions of 50 nm and less, such as 30 nm and less, as required in sophisticated applications.

In the manufacturing stage shown, the metallization layer 220 may comprise any appropriate dielectric material, such as a low-k dielectric material 221, or a ULK material and the like, possibly in combination with a cap material 223, which may provide superior stability, as is also discussed above. Furthermore, an etch stop layer 222 may be provided above the substrate 201 in order to provide superior control for patterning the dielectric material 221. It should be appreciated, however, that any other material configuration for a dielectric material of the layer 220 may be applied, depending on the specific device and process requirements. Moreover, a hard mask material 202 may be provided above the metallization layer 220 and may comprise one or more mask openings 202A, which substantially determine the lateral size and position of trenches to be formed in the materials 223 and 221. As discussed above, the lateral dimensions of corresponding metal lines and vias have to be adapted to the feature sizes in any lower lying device levels and may thus require critical dimensions of 100 nm and less in some illustrative embodiments. In this manner, scalability for forming metallization layers may be accomplished, while, in other illustrative embodiments, greater critical dimensions may be applied, thereby also contributing to superior uniformity of the resulting semiconductor devices. The mask layer 202 may be comprised of any appropriate material or materials, as are, for instance, also discussed above with reference to the semiconductor device 100.

The semiconductor device 200 may be formed on the basis of manufacturing strategies as are also previously discussed with reference to the device 100. After forming the trench mask 202, further processing may be continued by performing a process 230, in which the cross-sectional shape of the mask opening 202A is modified so as to provide superior process conditions during the further processing. For example, the process 230 may represent a plasma-assisted etch process so as to remove a certain amount of material of the layer 202, thereby also contributing to an edge rounding in the openings 202A. It should be appreciated that a corresponding material erosion in the layer 202 may be readily taken into consideration by providing an appropriate initial thickness thereof. Appropriate process parameters for plasma-based recipes of the process 230 may be readily established by starting from conventional etch recipes, for instance those used for patterning the mask material 202, and applying any such recipes with appropriately adapted parameters without an additional etch mask.

In other illustrative embodiments, the process 230 may represent an ion sputtering process, in which any appropriate atomic or molecular species may be ionized and accelerated so as interact with exposed surface areas, thereby preferably removing material at the edges 202E due to the increased density of incoming particles in this area. Similarly, a plurality of material erosion processes may be applied, which may provide a certain degree of material removal of the material 202, thereby also efficiently rounding the edges 202E.

Figure 2B:
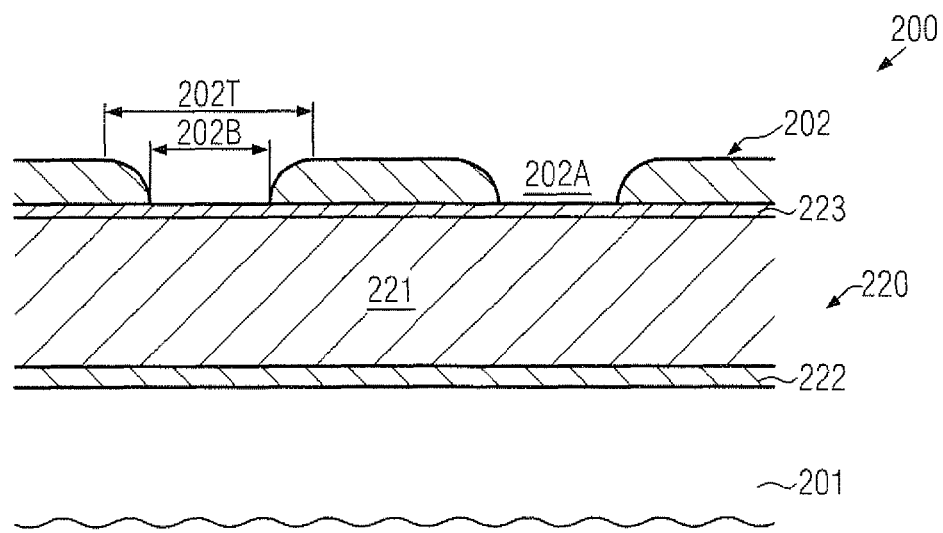

FIG. 2b schematically illustrates the semiconductor device 200 after completing the process 230 of FIG. 2a. As illustrated, the mask opening 202A may have an increased width at the top thereof, as indicated by 202T, while a width at the bottom, indicated by 202B, may still substantially correspond to the initial width of the opening 202A. Consequently, the cross-sectional shape may be provided in a tapered manner, which is to be understood in this application that the opening 202A may have an increased width, i.e., the width 202T at the top thereof in the width direction, i.e., in FIG. 2b in the horizontal direction, while the width 202B at the bottom is reduced.

Figure 2C:
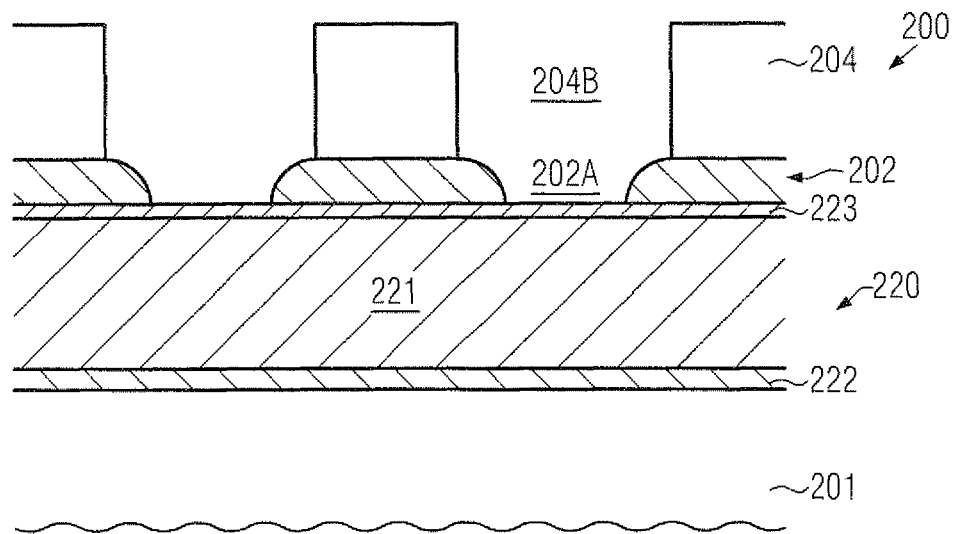

FIG. 2c schematically illustrates the device 200 in a further advanced manufacturing stage, in which a further etch mask 204 may be provided so as to basically determine the position of vias openings to be formed in the dielectric material of the metallization layer 220. In the embodiment shown, the mask 204 may comprise a mask opening 204B having a lateral dimension in the width direction, i.e., in the horizontal direction of FIG. 2c, that may accommodate any process-related variations so that the mask opening 202A may be reliably exposed by the opening 204B, as is also previously explained. The etch mask 204 may be provided in the form of any appropriate material or material system, such as a resist material, a combination of two or more organic materials and the like, depending on the overall process strategy. For example, a planarization material may be provided and may be subsequently patterned on the basis of a resist mask in order to provide the etch mask 204, while, in other cases, a resist material patterned by lithography may be used as the mask 204.

Figure 2D:
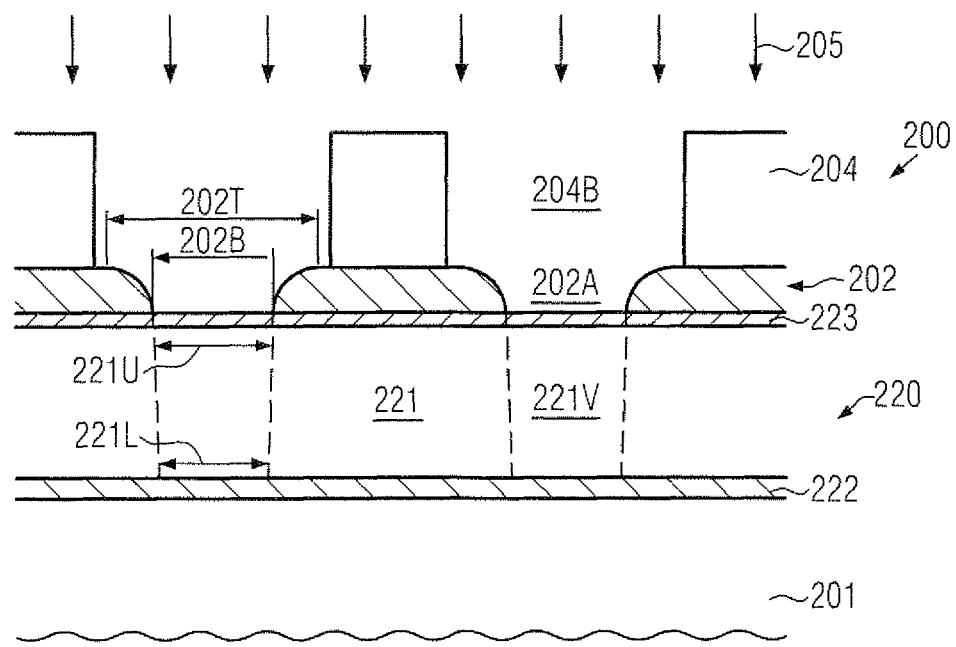

FIG. 2d schematically illustrates the device 200 during an anisotropic etch process 205, which may be performed on the basis of an etch chemistry having a moderately high etch selectivity with respect to the material of the mask 202. Consequently, a via opening 221V may be formed during the process 205, wherein, in an initial phase, the etch stop effects of the material 202 may still be sufficient to transfer the bottom dimension 202B into the material 221. During the further advance of the etch process 205, material of the mask material 202 may be removed at the edges so as to continuously increase the lateral size of the resulting via opening 221V, which may thus comprise a bottom width 221L, which may be substantially determined by a bottom width 202B of the opening 202A, while a width 221U at the top of via opening 221V may be effected by the top width 202T of the opening 202A. With respect to any process parameters for the process 205, any well-established process recipes may be applied.

In other illustrative embodiments (not shown), the process 230 (FIG. 2a) may be performed after providing the via etch mask 204 so that the corresponding material erosion may be substantially restricted to the opening 204B, which may be advantageous if corresponding edge rounding along the entire length extension of trenches still to be formed is considered inappropriate.

Figure 2E:
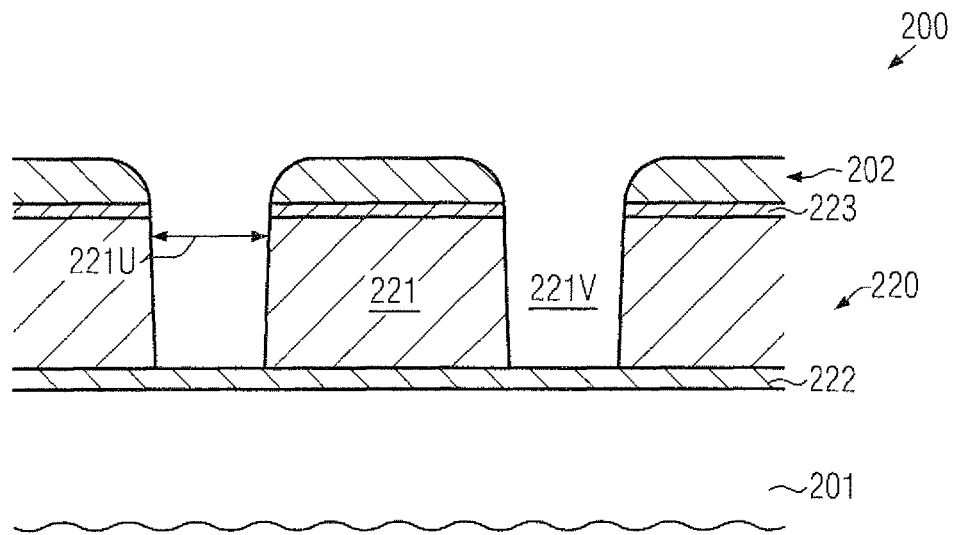

FIG. 2e schematically illustrates the device 200 in a further advanced manufacturing stage, in which the via openings 221V are formed in the material 221 so as to extend to the etch stop layer 222. Consequently, the lateral dimension 221U may be increased, depending on the degree of edge rounding of the mask material 202, as discussed above. On the other hand, the via openings 221V may be appropriately aligned with the mask 202 and thus with any trenches to be subsequently formed on the basis of the trench mask 202.

Figure 2F:
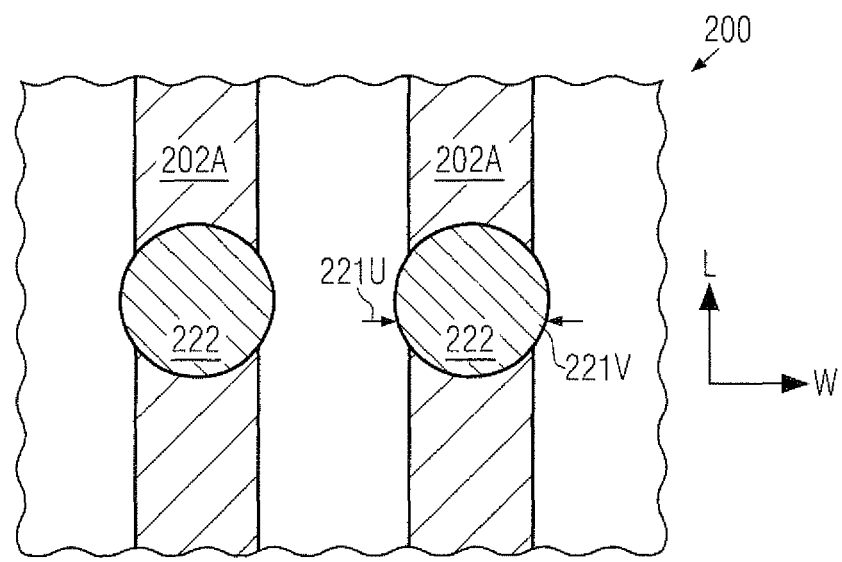
FIG. 2f schematically illustrates a top view illustrating the self-aligned via openings and the mask openings for the trench etch process, according to illustrative embodiments.

FIG. 2f schematically illustrates a top view of the device 200 after forming the via opening 221V. As illustrated, the openings 221V may have the slightly increased lateral dimension 221U along the width direction, indicated as W, while nevertheless a precise alignment with the trench mask 202A may be obtained, which may thus extend along the length direction, indicated as L, and which may thus determine the lateral position and dimensions of corresponding trenches still to be formed. Consequently, the increased dimension 221U may provide superior fill conditions in a later manufacturing stage, however, without unduly increasing the probability of creating additional leakage paths, as is, for instance, explained above with reference to FIG. 1d.

Figure 2G:
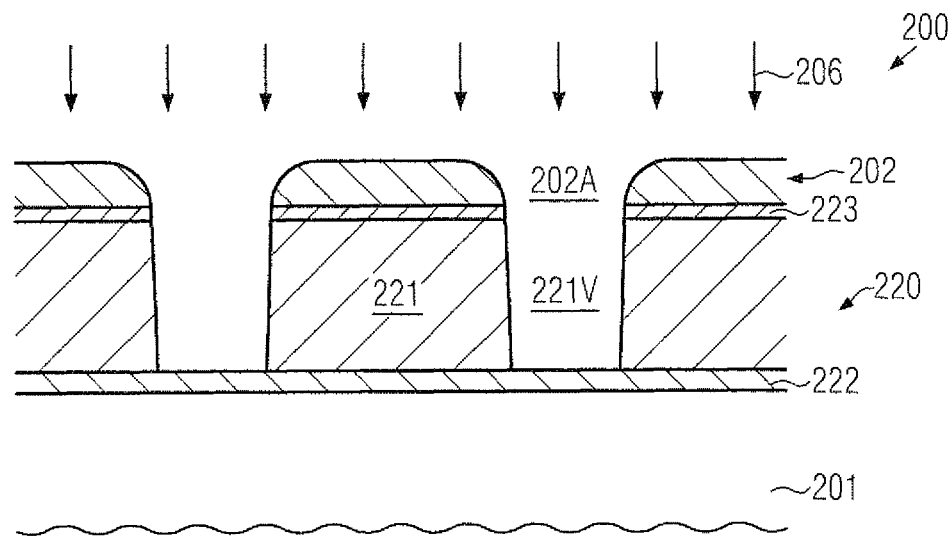
FIG. 2g schematically illustrates a cross-sectional view of the device upon forming trenches in a self-aligned manner to the via openings.

FIG. 2g schematically illustrates the semiconductor device 200 when exposed to a further anisotropic etch process 206 in order to form trenches in the dielectric material 221 on the basis of the trench mask 202. To this end, any appropriate anisotropic etch recipes may be applied. In the embodiment shown, it may be assumed that the tapering of the mask openings 202A may extend along the entire length, while, in other cases, as previously discussed, tapering of the openings 202A may be substantially restricted to the locations of the via openings 221V.

Figure 2H:
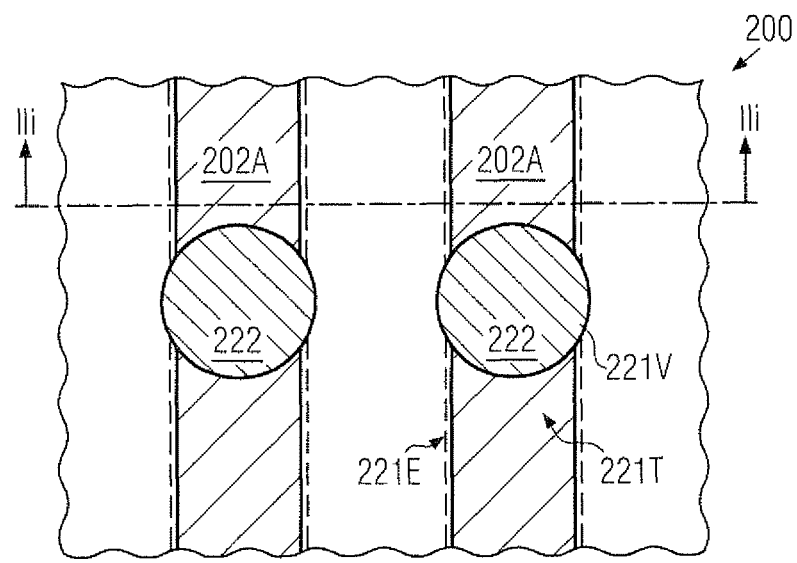
FIG. 2h schematically illustrates a top view of the self-aligned via opening and trench with slightly increased dimensions of the via opening, according to illustrative embodiments.

FIG. 2h schematically illustrates a top view of the device 200 after the etch process 206 of FIG. 2g. As illustrated, trenches 221T may be formed in the dielectric material so as to extend to a desired depth, wherein a certain degree of edge rounding at an area 221E may be provided in the trenches 221T, as discussed above.

Figure 2I:
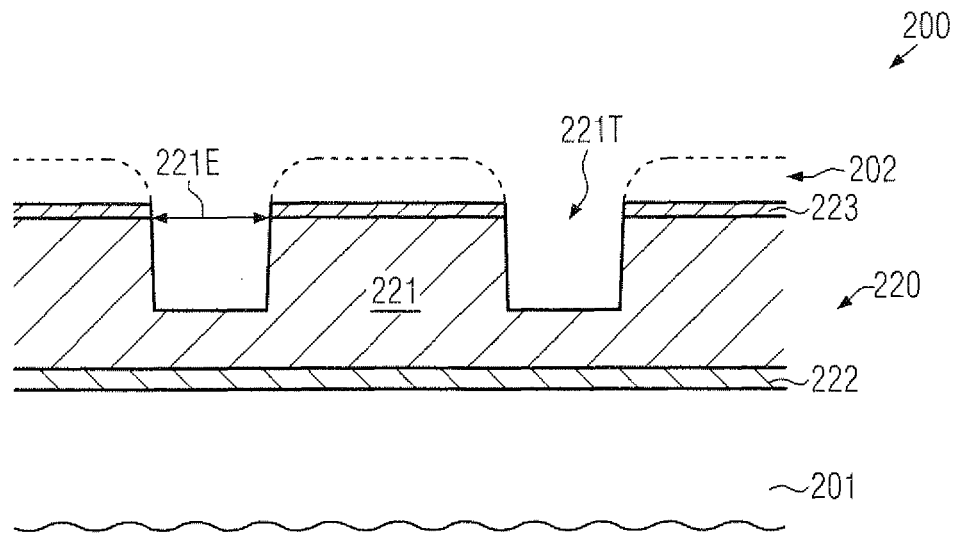
FIG. 2i schematically illustrates a cross-sectional view of the semiconductor device according to the sectional line of FIG. 2h.

FIG. 2i schematically illustrates the device 200 according to the section IIi as shown in FIG. 2h. Thus, in the embodiment shown, the edge region 221E may have a slightly increased dimension due to the tapering of the mask 202, as previously discussed, while, in other cases, a corresponding edge rounding may be restricted to the via openings 221V (FIG. 2g), as discussed above. Furthermore, in some illustrative embodiments, the mask material 202 may be removed after forming the one or more trenches 221T, while, in other illustrative embodiments, as indicated by the dashed line, the hard mask 202 may be preserved and may be used as a sacrificial material during the further processing for depositing any conductive materials, thereby providing superior integrity of the sensitive dielectric material 221. Consequently, as illustrated in FIGS. 2g and 2i, further processing may be continued on the basis of an improved cross-sectional shape of the trench 221T and the via opening 221V, which may enable a reliable filling of these openings on the basis of any appropriate process strategy. At the same time, deposition-related irregularities or generally inferior performance caused by any misalignments of vertical interconnects and trenches may be efficiently avoided or at least be significantly reduced.

Figure 2J:
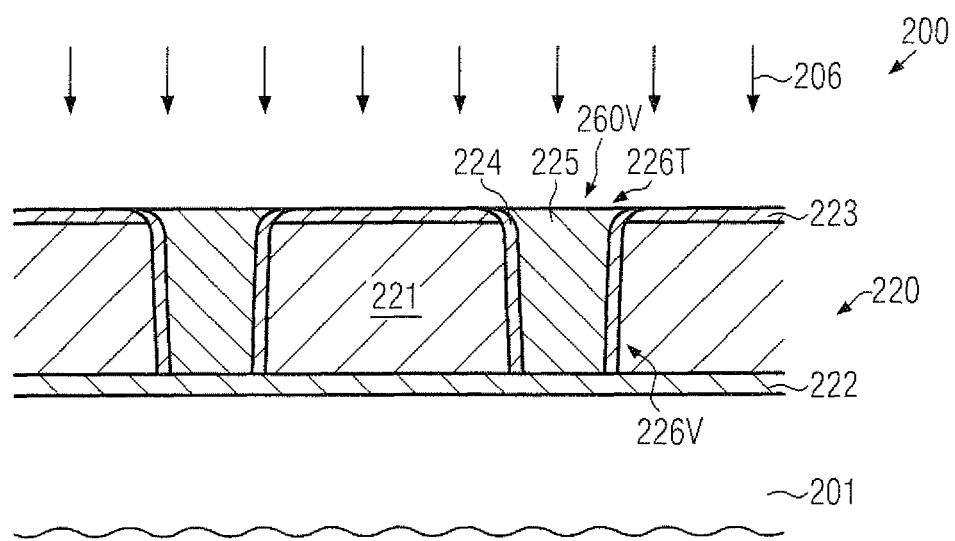
FIG. 2j schematically illustrates the semiconductor device in a further advanced manufacturing stage including self-aligned and vertical interconnects, according to illustrative embodiments.

FIG. 2j schematically illustrates the device 200 in a further advanced manufacturing stage. As illustrated, a metal line 226T may be provided in the dielectric material 221 of the layer 220 and may be aligned to a vertical interconnect or via 226V, due to the patterning sequence as described above. Furthermore, any appropriate barrier material, if required, indicated by 224, may be formed on sidewalls of the trench 226T and the via 226V, which may be provided with superior thickness uniformity and generally with a reduced thickness due to the superior cross-sectional shape of the corresponding openings. Similarly, a highly conductive material 225, such as copper, silver, copper alloys and the like, may be provided and may reliably fill the via opening 260V due to the superior deposition condition, as discussed above.

With respect to any process strategies for forming the materials 224 and 225, it may be referred to the semiconductor device 100, wherein it should be appreciated that, generally, a superior uniformity with respect to material characteristics, coverage of exposed surface areas, homogeneity of the fill material 225 and the like may be accomplished. After filling in the materials 224, 225, which may be accomplished in the presence of the hard mask 202 (FIG. 2i) or without the hard mask, any excess material may be removed, for instance by CMP and the like.

As a result, the present disclosure provides manufacturing techniques in which vertical interconnects, such as vias, contacts and the like, may be provided in a self-aligned manner with respect to metal lines, while at the same time providing a superior cross-sectional shape. To this end, at least a portion of a trench hard mask may be exposed to an edge rounding or corner rounding process in order to partially transfer the tapered cross-sectional shape into the underlying dielectric material. Consequently, the superior via and trench profiles result in improved metallization performance and thus also provide superior compatibility with complex material systems, such as ULK materials, while at the same time the self-aligned nature of the process strategy reduces any risk of leakage currents and dielectric breakdown.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a first etch mask above a dielectric material of a metallization layer of a semiconductor device, said first etch mask comprising a mask opening corresponding to a trench to be formed in said dielectric material;
   performing a material erosion process so as to round edges of said mask opening;
   forming a second etch mask above said first etch mask after performing said material erosion process, said second etch mask in combination with said mask opening determining a lateral position of a via opening to be formed in said dielectric material so as to connect to said trench;
   performing a first etch process so as to form said via opening by using said first and second etch masks as an etch stop material; and
   performing a second etch process so as to form said trench by using said first etch mask as an etch stop material.

2. The method of claim 1, wherein forming said second etch mask comprises providing said second etch mask with a mask opening having a lateral extension that is greater than a width of said trench.

3. The method of claim 1, further comprising forming a conductive material in said trench and said via opening by performing a common deposition process sequence.

4. The method of claim 1, wherein forming said first etch mask comprises forming at least one hard mask material above said dielectric material and patterning said at least one hard mask material so as to form a trench opening therein.

5. The method of claim 1, wherein forming said second etch mask comprises forming a resist mask above said first etch mask and using said resist mask as said second etch mask.

6. The method of claim 1, wherein forming said second etch mask comprises forming a mask material above said first etch mask, forming a resist mask above said mask material, patterning said mask material on the basis of said resist mask and using said patterned mask material as said second etch mask.

7. The method of claim 1, wherein said dielectric material is formed so as to comprise a low-k dielectric material.

8. The method of claim 1, wherein said trench is formed with a width of approximately 100 nm or less.

9. The method of claim 1, wherein performing said material erosion process comprises performing a plasma-assisted etch process.

10. The method of claim 1, wherein performing said material erosion process comprises applying an ion sputtering process.

11. A method, comprising:
    forming a trench hard mask above a dielectric material of a metallization layer of a semiconductor device, said trench hard mask comprising a first mask opening having an upper edge and a bottom;
    increasing a width of said first mask opening selectively at least in a portion of said upper edge while preserving a width of said first mask opening at said bottom;
    forming a via etch mask above said trench hard mask, said via etch mask comprising a second mask opening positioned to expose a portion of said first mask opening;
    forming a via opening in said dielectric material by using said trench hard mask and said via etch mask as an etch mask; and
    forming a trench in said dielectric material by using said trench hard mask.

12. The method of claim 11, wherein increasing a width of said first mask opening selectively at least in a portion of said upper edge is performed prior to forming said via etch mask.

13. The method of claim 11, wherein increasing a width of said first mask opening selectively at least in a portion of said upper edge is performed in the presence of said via etch mask.

14. The method of claim 11, further comprising forming at least one conductive material in said trench and said via opening by performing a deposition process commonly for said trench and said via opening.

15. The method of claim 11, wherein forming said trench hard mask comprises forming at least one of titanium, titanium nitride, tantalum nitride and aluminum above said dielectric material.

16. The method of claim 11, wherein forming said via etch mask comprises providing said second mask opening with an extra width so as to laterally extend outside of said first mask opening.

17. The method of claim 11, wherein increasing a width of said first mask opening selectively in at least a portion of said upper edge comprises performing at least one of a plasma-assisted etch process and an ion sputter process.

18. A method of forming a metallization system of a semiconductor device, the method comprising:

forming a dielectric layer above a substrate, said dielectric layer comprising a low-k dielectric material;

forming a hard mask above said dielectric layer so as to include a mask opening defining the lateral size and position of a trench of a metal line to be formed in said dielectric layer;

rounding upper edges of said mask opening so as to increase a width of said mask opening at said upper edges;

forming a via etch mask above said hard mask so as to expose a portion of said mask opening and a portion of said hard mask laterally adjacent to said mask opening;

forming a via opening in said dielectric layer by using said hard mask and said via etch mask as etch masks;

removing said via etch mask;

forming said trench in said dielectric layer by using said hard mask; and forming a conductive material in said trench and said via opening.

19. The method of claim 18, wherein a width of said trench is approximately 100 nm or less.

20. The method of claim 18, wherein rounding said upper edges comprises performing at least one of an etch process and an ion sputter process.

* * * * *